United States Patent [19]

Regan et al.

[11] Patent Number: 4,591,809

[45] Date of Patent: May 27, 1986

[54] HIGH FREQUENCY POWER SOURCE

[75] Inventors: Robert J. Regan, Needham; Scott J. Butler, Auburn; Zvi Ben-Aharon, Framingham, all of Mass.

[73] Assignee: GTE Laboratories Incorporated, Waltham, Mass.

[21] Appl. No.: 685,429

[22] Filed: Dec. 24, 1984

[51] Int. Cl.$^4$ .......................... H03B 5/00; H03F 3/04
[52] U.S. Cl. ........................ 331/117 R; 331/117 FE; 330/137
[58] Field of Search ................ 331/117 FE, 117 R; 330/137, 310, 311

[56] References Cited

U.S. PATENT DOCUMENTS 3,619,804  11/1971  Mears ........................... 331/117 FE
4,342,967  8/1982  Regan et al. ...................... 330/311

Primary Examiner—Eugene La Roche
Assistant Examiner—G. Wan
Attorney, Agent, or Firm—David M. Keay

[57] ABSTRACT

A power source consisting of a low power high frequency oscillator section driving a high power high gain amplifier section. The amplifier section includes one or more SIT's. The dc operating potential is applied to the drain electrode of one of the SIT's and is supplied to the other through a dc path from the source electrode of the one SIT to the drain electrode of the other. Operating potential from the dc biasing network between the gate and source electrodes of an SIT in the amplifier section is conducted through a dc path to a transistor in the oscillator section to provide operating power for the oscillator section. The oscillator output is connected through a high frequency coupling dc blocking path to the amplifier input to provide a drive signal to be amplified and extracted at the amplifier output.

10 Claims, 2 Drawing Figures

4,591,809

HIGH FREQUENCY POWER SOURCE

REFERENCE TO RELATED APPLICATION

This application is related to application Ser. No. 685,430 filed concurrently herewith by Zvi Ben-Aharon, Robert J. Regan, and Scott J. Butler entitled "High Frequency Energy Source" and assigned to the assignee of the present application.

BACKGROUND OF THE INVENTION

This invention relates to apparatus for producing high frequency output signals. More particularly, it is concerned with solid state high frequency power sources which employ an oscillator driving a power amplifier.

Conventional solid state high frequency power sources typically employ a low power oscillator which drives a single or multiple stage high gain amplifier. To supply dc operating power to the amplifier and the oscillator the apparatus either employs two power supplies or a single power supply having two separate power distribution networks.

One type of amplifying device which provides high gain at very high microwave frequencies is the static induction transistor (SIT), a particular type of junction field effect transistor. To obtain relatively high efficiency operation, it is necessary that SIT's be operated in class B or class C conditions. In order to provide appropriate bias between the electrodes of an SIT for class B or class C operation, it is necessary either to employ a separate voltage source or a self-biasing network which adds to circuit complexity and also reduces overall efficiency.

SUMMARY OF THE INVENTION

An improved high frequency power source in accordance with the present invention comprises an output connection, an oscillator section for producing a high frequency signal, and an amplifier section coupled to the oscillator section for producing an amplified high frequency signal. The oscillator section includes an oscillator transistor having first, second, and third electrodes. The amplifier section includes an amplifier transistor having first, second, and third electrodes and means for connecting the first electrode of the amplifier transistor to a source of dc operating potential. A dc biasing means is connected between the second and third electrodes of the amplifier transistor for producing a dc bias voltage therebetween. Output means including dc blocking means couples the first electrode of the amplifier transistor to the output connection. A dc connecting means including rf blocking means couples the second electrode of the amplifier transistor to the first electrode of the oscillator transistor whereby a dc conductive path is provided from the source of operating potential through the amplifier transistor to the oscillator transistor. An rf connecting means including dc blocking means couples the first electrode of the oscillator transistor to the third electrode of the amplifier transistor whereby an rf conductive path is provided. The power which would otherwise be dissipated in the dc biasing means of the amplifier section provides dc operating power to the oscillator section, the high frequency output of which provides the drive signal to the amplifier section.

For a better understanding of the present invention, together with other and further objects, advantages, and capabilities thereof, reference is made to the following disclosure and appended claims in connection with the above-described drawings.

DETAILED DESCRIPTION OF THE INVENTION

Figure 1:
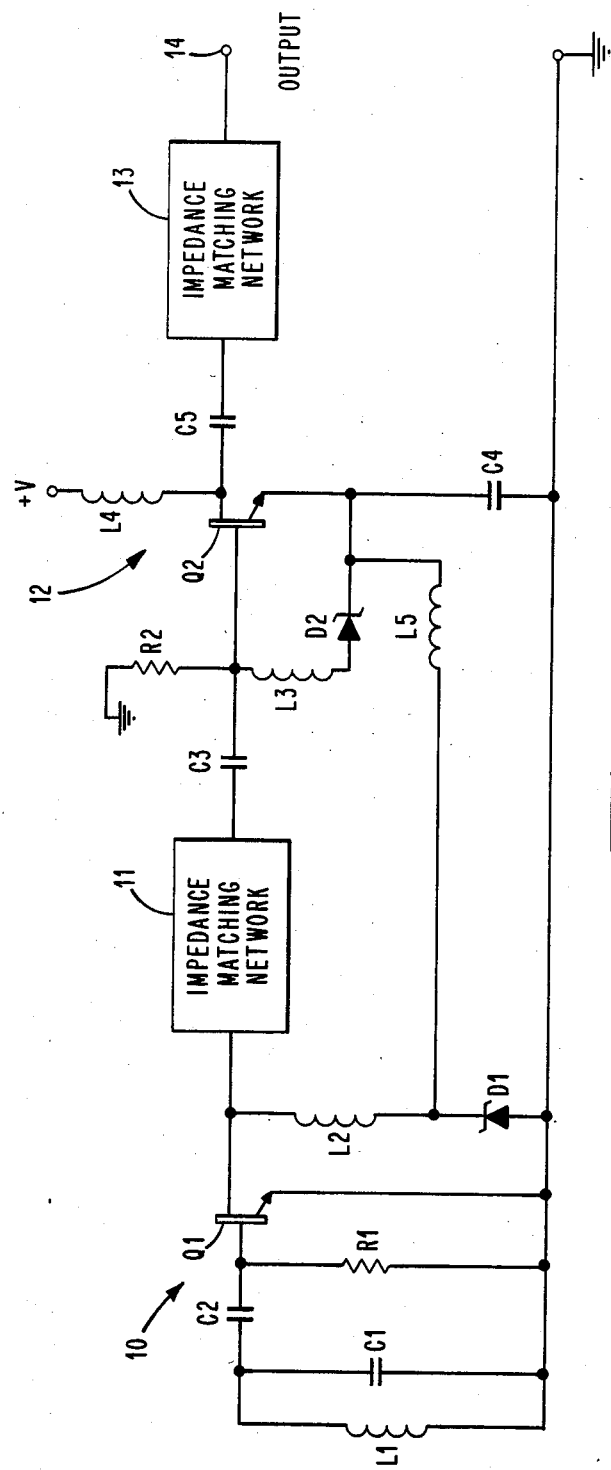
FIG. 1 is a schematic circuit diagram of a high frequency energy source in accordance with the present invention.

FIG. 1 illustrates a high frequency energy source in accordance with the present invention. The circuit includes a high frequency oscillator section 10 employing a single transistor Q1. The oscillator section generates a high frequency output signal at the output electrode of the transistor Q1. The high frequency signal is conducted through an appropriate impedance matching network 11 to an amplifier section 12. The amplifier section 12 as shown in FIG. 1 employs a single junction field effect transistor Q2 of the SIT type. The amplified high frequency signal from the amplifier section is applied through an impedance matching network 13 to an output terminal 14.

In the circuit illustrated in FIG. 1 the transistor Q1 of the oscillator section 10 is also a junction field effect transistor of the SIT type. The source of SIT Q1 is connected directly to ground. The gate of SIT Q1 is connected to ground through a resistance R1 and through a capacitance C2 in series with a parallel arrangement of an inductance L1 and a capacitance C1 to ground. The drain is connected to ground through an inductance or rf choke L2 and a zener diode D1 as shown in FIG. 1.

The output of the oscillator section 10 is taken from the drain of SIT Q1 and applied through the impedance matching network 11 and a dc blocking capacitance C3 to the gate of the SIT Q2 in the amplifier section 12. A positive dc voltage source +V is connected to the drain of the SIT Q2 by way of an rf choke or inductance L4. The source of the SIT Q2 is connected to ground through a capacitance C4. An inductance or rf choke L3 and zener diode D2, arranged as shown in FIG. 1, are connected in series between the gate and the source of the SIT Q2. The gate of the SIT Q2 is also connected to ground through a resistance R2. The source of the SIT Q2 is connected to the juncture of inductance L2 and zener diode D1 of the oscillator section 10 by an inductance or rf choke L5 in order to provide operating potential thereto as will be explained hereinbelow. The drain of the SIT Q2 is connected by way of a capacitance C5 and an impedance matching network 13 to the output terminal 14.

In the circuit of FIG. 1 the source of the SIT Q2 is biased positive with respect to the gate by virtue of the dc biasing network of inductance L3, zener diode D2 and resistance R2. Because of the dc biasing network the amplifier section 12 operates in an efficient class B or class C condition. In accordance with the present invention the dc biasing potential at the source of the SIT Q2 is applied to the drain of the SIT Q1 by the dc path through the rf chokes L5 and L2. Thus, a dc path is provided from the source of operating voltage +V through the SIT Q2 and through the SIT Q1 of the oscillator section 10.

The oscillator section 10 produces a high frequency output signal at the drain of the SIT Q1. This signal is coupled to the gate of the SIT Q2 in the amplifier section 12 by the rf path provided by the impedance matching network 11 and capacitance C3. The high frequency signal is amplified by the amplifier section 12 and the amplifier signal is passed to the output terminal 14.

Figure 2:
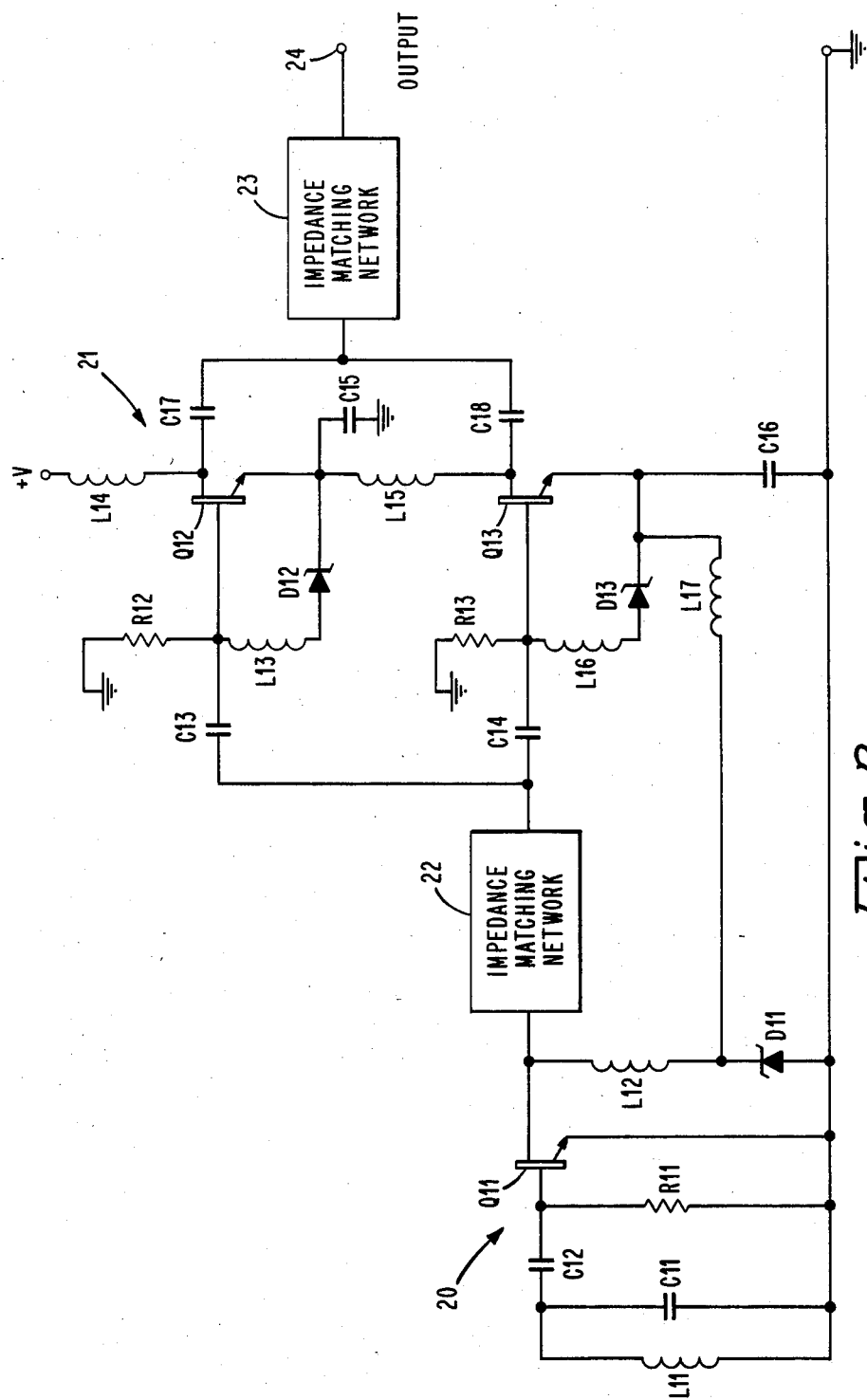
FIG. 2 is a schematic circuit diagram of another high frequency energy source in accordance with the present invention.

FIG. 2 is a circuit diagram illustrating another version of a high frequency power source in accordance with the present invention. The circuit of FIG. 2 employs an SIT Q11 in the oscillator section 20. The amplifier section 21 employs two SIT's Q12 and Q13 connected in an amplifier arrangement of the type disclosed and claimed in application Ser. No. 604,778 filed Apr. 27, 1984, entitled "High Voltage, High Frequency Amplifier" by Scott J. Butler, Robert J. Regan, and Anthony B. Varallo and assigned to the assignee of the present application.

The source of the SIT Q11 in the oscillator section 20 is connected directly to ground. The gate is connected to ground through a resistant R11 and also through a capacitance C12 in series with a inductance L11 and capacitance C11 in parallel. The drain of the SIT Q11 is connected to ground through an inductance or rf choke L12 and a zener diode D11, arranged as shown in FIG. 2. The output of the oscillator section is taken at the drain of SIT Q11 through an impedance matching network 22 to the gates of SIT's Q12 and Q13 of the amplifier section 21 by way of capacitances C13 and The amplifier section 21 includes he two SIT's Q12 and Q13 connected in series to a single power source +V so as to provide a dc path through the SIT's. The SIT's provide two parallel rf paths for amplifying the high frequency signal in accordance with the teachings of the aforementioned previously filed application. The dc source of operating potential +V is connected to the drain of SIT Q12 through an rf choke of inductance L14. The source of SIT Q12 is connected to ground through a high frequency ac conducting path, capacitance C15. The gate of SIT Q12 is connected to ground through a resistance R12, and the gate and source of SIT Q12 are connected by an inductance or rf choke L13 and a zener diode D12 arranged as shown in FIG. 2. The source of the SIT Q12 is connected by an inductance or rf choke L15 to the drain of SIT Q13. The source of SIT Q13 is connected to ground through a high frequency ac conducting path, capacitance C16. The gate of SIT Q13 is connected to ground through a resistance R13, and the gate and source are connected by an inductance or rf choke L16 and a zener diode D13.

The amplified output signals from the SIT's Q12 and Q13 are taken from their drains by way of capacitances C17 and C18, respectively, which have their outputs connected together and through an impedance matching network 23 to an output terminal 24. Operating potential for the oscillator section 20 is taken from the source of SIT Q13 by way of inductances or rf chokes L17 and L12.

High frequency power sources in accordance with the present invention combine a high frequency low power oscillator and a high gain power amplifier so as to provide relatively efficient operation. The source utilizes some of the power which otherwise would be dissipated in the dc biasing network of the amplifier operating under class B or class C conditions. No power supplies other than a single dc voltage source are required and the circuitry is relatively uncomplicated.

While there has been shown and described what are considered preferred embodiments of the present invention, it will be obvious to those skilled in the art that various changes and modifications may be made therein without departing from the invention as defined by the appended claims.

What is claimed is:

1. A high frequency power source comprising
   an output connection;
   an oscillator section for producing a high frequency signal including an oscillator transistor having first, second, and third electrodes;
   an amplifier section coupled to the oscillator section for producing an amplified high frequency signal;
   said amplifier section including
      an amplifier transistor having first, second, and third electrodes,
      means for connecting the first electrode of the amplifier transistor to a source of dc operating potential,
      dc biasing means connected between the second and third electrodes of the amplifier transistor for producing a dc bias voltage therebetween, and
      output means including dc blocking means coupling the first electrode of the amplifier transistor to said output connection;
   dc connecting means including rf blocking means coupling the second electrode of the amplifier transistor to the first electrode of the oscillator transistor whereby a dc conductive path is provided from the source of operating potential through the amplifier transistor to the oscillator transistor; and
   rf connecting means including dc blocking means coupling the first electrode of the oscillator transistor to the third electrode of the amplifier transistor whereby an rf conductive path is provided.

2. A high frequency power source in accordance with claim 1 wherein
   said means for connecting the first electrode of the amplifier transistor to a source of operating potential includes rf blocking means.

3. A high frequency power source in accordance with claim 1 wherein
   said amplifier transistor is a field effect transistor; and
   said first electrode is a drain electrode, said second electrode is a source electrode, and said third electrode is a gate electrode.

4. A high frequency power source in accordance with claim 1 wherein
   said amplifier transistor is a static induction transistor; and
   said first electrode is a drain electrode, said second electrode is a source electrode, and said third electrode is a gate electrode.

5. A high frequency power source comprising
   an output connection;
   an oscillator section for producing a high frequency signal including an oscillator transistor having first, second, and third electrodes;
   an amplifier section coupled to the oscillator section for producing an amplified high frequency signal;
   said amplifier section including
      first and second amplifier transistors each having first, second, and third electrodes, means for connecting the first electrode of the first amplifier transistor to a source of dc operating potential, first dc biasing means connected between the second and third electrodes of the first amplifier transistor for producing a dc bias voltage therebetween, rf blocking means connecting the second electrode of the first amplifier transistor to the first electrode of the second amplifier transistor, second dc biasing means connected between the second and third electrodes of the second amplifier transistor for producing a dc bias voltage therebetween, and output means including dc blocking means coupling the first electrode of the first amplifier transistor and the first electrode of the second amplifier transistor to said output connection;

dc connecting means including rf blocking means coupling the second electrode of the second amplifier transistor to the first electrode of the oscillator transistor whereby a dc conductive path is provided from the source of operating potential through the first amplifier transistor and the second amplifier transistor in series to the oscillator transistor; and rf connecting means including dc blocking means coupling the first electrode of the oscillator transistor to the third electrode of the first amplifier transistor and to the third electrode of the second amplifier transistor whereby rf conductive paths are provided.

6. A high frequency power source in accordance with claim 5 wherein said means for connecting the first electrode of the first amplifier transistor to a source of dc operating potential includes rf blocking means.

7. A high frequency power source in accordance with claim 6 wherein said first and second amplifier transistors are field effect transistors; and said first electrodes are drain electrodes, said second electrodes are source electrodes, and said third electrodes are gate electrodes.

8. A high frequency power source in accordance with claim 6 wherein said first and second amplifier transistors are static induction transistors; and said first electrodes are drain electrodes, said second electrodes are source electrodes, and said third electrodes are gate electrodes.

9. A high frequency power source in accordance with claim 8 wherein said dc blocking means include capacitances; and said rf blocking means include inductances.

10. A high frequency power source in accordance with claim 9 wherein said first dc biasing means includes a voltage reference diode connected between the source and gate electrodes of the first amplifier transistor; and said second dc biasing means includes a voltage reference diode connected between the source and gate electrodes of the second amplifier transistor.

* * * * *